(12) United States Patent
Okada et al.

(10) Patent No.: US 7,923,357 B2
(45) Date of Patent: Apr. 12, 2011

(54) METHOD FOR FORMING POLY-SILICON FILM

(75) Inventors: Mitsuhiro Okada, Nirasaki (JP); Takahiro Miyahara, Nirasaki (JP); Toshiharu Nishimura, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 216 days.

(21) Appl. No.: 12/285,574

(22) Filed: Oct. 8, 2008

(65) Prior Publication Data

US 2009/0124077 A1 May 14, 2009

(30) Foreign Application Priority Data

Oct. 12, 2007 (JP) ................. 2007-266558

(51) Int. Cl.
*H01L 21/20* (2006.01)
*H01L 21/04* (2006.01)

(52) U.S. Cl. . 438/486; 438/488; 438/511; 257/E31.047; 257/E21.316

(58) Field of Classification Search .......... 438/486, 438/488, 511; 257/E31.047, E21.316
See application file for complete search history.

(56) References Cited

U.S. PATENT DOCUMENTS

| 4,642,414 | A | * | 2/1987 | Rasch et al. | 136/256 |
| 5,894,037 | A | * | 4/1999 | Kikuchi et al. | 427/372.2 |
| 2005/0260862 | A1 | * | 11/2005 | Komatsu et al. | 438/762 |
| 2006/0051911 | A1 | * | 3/2006 | Gu et al. | 438/166 |

FOREIGN PATENT DOCUMENTS

| JP | 7-86173 | 3/1995 |
| JP | 9-129562 | 5/1997 |

* cited by examiner

*Primary Examiner* — Hsien-ming Lee
*Assistant Examiner* — Kevin Parendo
(74) *Attorney, Agent, or Firm* — Smith, Gambrell & Russell, LLP

(57) ABSTRACT

A poly-silicon film formation method for forming a poly-silicon film doped with phosphorous or boron includes heating a target substrate placed in a vacuum atmosphere inside a reaction container, and supplying into the reaction container a silicon film formation gas, a doping gas for doping a film with phosphorous or boron, and a grain size adjusting gas containing a component to retard columnar crystal formation from a poly-silicon crystal and to promote miniaturization of the poly-silicon crystal, thereby depositing a silicon film doped with phosphorous or boron on the target substrate.

11 Claims, 12 Drawing Sheets

METHOD FOR FORMING POLY-SILICON FILM

BACKGROUND OF THE INVENTION

1. Field of the Invention

The present invention relates to a poly-silicon film formation method for forming a poly-silicon film (polycrystalline silicon film) doped with phosphorous or boron on a target substrate, such as a semiconductor wafer, and particularly to a technique used for a semiconductor process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

Semiconductor devices comprise various thin films, one of which is a poly-silicon film doped with phosphorous (P) or boron (B). Such doped poly-silicon films are used for resistor elements, gate electrodes, and interconnection lines.

Where doped poly-silicon films of this kind are formed, low-pressure CVD (Chemical Vapor Deposition) is commonly used, because this process is high in controllability and does not generate damage to a target substrate unlike ion implantation.

Conventionally, vertical heat processing apparatuses are widely used to form poly-silicon films doped with phosphorous by low-pressure CVD. Where a poly-silicon film doped with phosphorous is formed in a vertical heat processing apparatus, a wafer boat with a number of semiconductor wafers (which may be simply referred to as wafers) supported thereon is loaded into a reaction tube. Then, the interior of the reaction tube is set at a temperature of, e.g., 590° C. or more, and process gases, such as monosilane ($SiH_4$) gas and phosphine ($PH_3$) gas are supplied into the reaction tube, while the interior of the reaction tube is set at a predetermined vacuum level (for example, Jpn. Pat. Appln. KOKAI Publication No. 9-129562). There is an alternative method, in which disilane ($Si_2H_6$) gas is used as a film formation gas in place of monosilane gas, and the process temperature is set at, e.g., 580° C. or less to form an amorphous silicon film doped with phosphorous, and then, the amorphous silicon film is annealed and poly-crystallized at a temperature of, e.g., 600 to 1,000° C. (for example, Jpn. Pat. Appln. KOKAI Publication No. 7-86173).

In recent years, design rules for semiconductor devices have been changed increasingly toward miniaturization, which requires very high process accuracy in forming patterns. However, where a poly-silicon film doped with phosphorous is formed by the techniques described above, the crystal grain size of the film has a lower limit of about 300 nm, which makes it difficult to satisfy a required micro-fabrication.

BRIEF SUMMARY OF THE INVENTION

An object of the present invention is to provide a poly-silicon film formation method for forming a poly-silicon film, which allows a poly-silicon film doped with phosphorous or boron to have fine crystal grains.

According to a first aspect of the present invention, there is provided a poly-silicon film formation method for forming a poly-silicon film doped with phosphorous or boron, the method comprising: heating a target substrate placed in a vacuum atmosphere inside a reaction container, and supplying into the reaction container a silicon film formation gas, a doping gas for doping a film with phosphorous or boron, and a grain size adjusting gas containing a component to retard columnar crystal formation from a poly-silicon crystal and to promote miniaturization of the poly-silicon crystal, thereby depositing a silicon film doped with phosphorous or boron on the target substrate.

According to a second aspect of the present invention, there is provided a poly-silicon film formation method for forming a poly-silicon film doped with phosphorous or boron, the method comprising: depositing an amorphous silicon film doped with phosphorous or boron on the target substrate, while setting an interior of a reaction container accommodating a target substrate at a first pressure of a vacuum atmosphere and a first temperature of 400 to 650° C., and supplying into the reaction container a silane family gas at first flow rate, a doping gas for doping a film with phosphorous or boron at a second flow rate smaller than the first flow rate, and a grain size adjusting gas, which contains a component to retard columnar crystal formation from a poly-silicon crystal and to promote miniaturization of the poly-silicon crystal, at a third flow rate smaller than the first flow rate, the grain size adjusting gas comprising at least one gas selected from the group consisting of $C_2H_4$ gas, $N_2O$ gas, NO gas, and $NH_3$ gas; and performing a heat process on the amorphous silicon film, while setting the interior of the reaction container accommodating the target substrate at a second pressure higher than the first pressure and a second temperature of 550 to 1,100° C. and higher than the first temperature, thereby transforming the amorphous silicon film into a poly-silicon film doped with phosphorous or boron.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
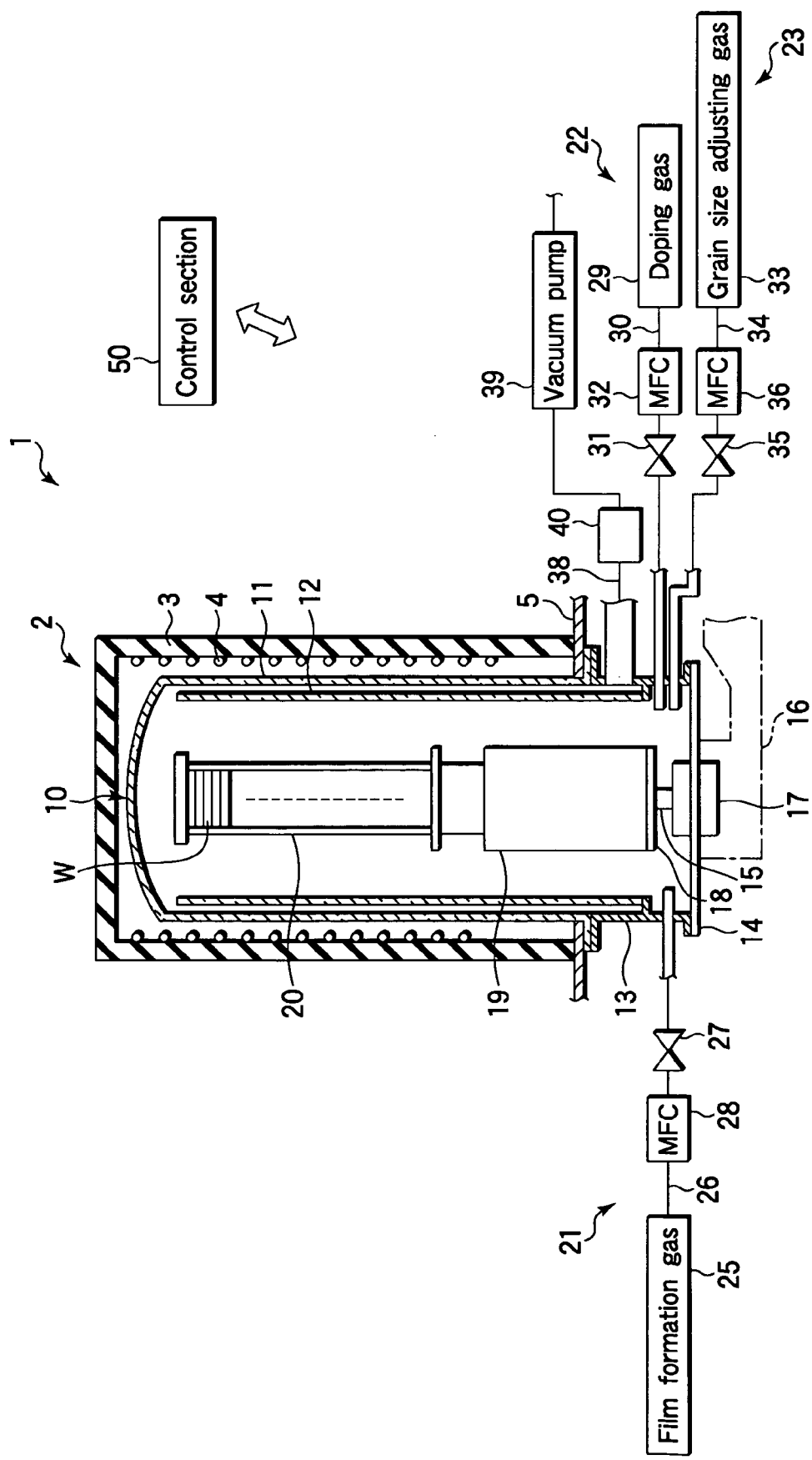
FIG. 1 is a sectional front view showing a film formation apparatus for performing a film formation method according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary.

FIG. 1 is a sectional front view showing a film formation apparatus for performing a film formation method according to an embodiment of the present invention. The film formation apparatus 1 includes a furnace 2 formed of a cylindrical heat-insulating casing 3 having a ceiling plate and a heater 4 disposed in the inner surface of the heat-insulating casing 3. The furnace 2 is supported on a base plate 5.

The furnace 2 covers a reaction container or reaction tube 10 having a double tube structure formed of an outer tube 11 and an inner tube 12. The outer tube 11 is made of, e.g., quartz and has a closed top, while the inner tube 12 is made of, e.g., quartz and is concentrically disposed inside the outer tube 11. The heater 4 is set to surround the reaction tube 10.

The outer tube 11 and inner tube 12 are supported at their bottoms by a cylindrical manifold 13 made of, e.g., stainless steel. The manifold 13 has a bottom port, which is opened and closed in an airtightly sealed state by a cap portion 14.

The cap portion 14 is provided with a rotary shaft 15 extending at the center and rotatably supported by, e.g., a magnetic-fluid seal in an airtightly sealed state. The lower end of the rotary shaft 15 is connected to a rotating mechanism 17 supported by an elevating stage 16, and the upper end of the rotary shaft 15 is fixed to a turn table 18. A wafer holder or wafer boat 20 made of, e.g., quartz is placed on the turn table 18 through a heat-insulating cylinder 19. The wafer boat 20 is structured to support a number of, such as about 50 to 150, wafers W stacked in the vertical direction at predetermined intervals. The elevating stage 16 is moved up and down by an elevating mechanism (not shown) to load and unload the wafer boat 20 into and from the reaction tube 10. When the wafer boat 20 is loaded into the reaction tube 10, the cap portion 14 comes into close contact with the manifold 13 to set this portion in an airtightly sealed state The film formation apparatus 1 includes a film formation gas supply mechanism 21, a doping gas supply mechanism 22, and a grain size adjusting gas supply mechanism 23. The film formation gas supply mechanism 21 is used for supplying a film formation gas into the reaction tube 10. The doping gas supply mechanism 22 is used for supplying a doping gas into the reaction tube 10. The grain size adjusting gas supply mechanism 23 is used for supplying a gas for adjusting the crystal grain size of a doped poly-silicon film to be formed, into the reaction tube 10.

The film formation gas supply mechanism 21 includes a film formation gas supply source 25 and a film formation gas line 26 penetrating the sidewall of the manifold 13 near the bottom to supply the film formation gas from the film formation gas supply source 25. The film formation gas line 26 is provided with a switching valve 27 and a flow rate controller 28, such as a mass flow controller, to supply the film formation gas at a controlled flow rate. The film formation gas may be a silane family gas, such as monosilane ($SiH_4$) gas or disilane ($Si_2H_6$) gas.

The doping gas supply mechanism 22 includes a doping gas supply source 29 and a doping gas line 30 penetrating the sidewall of the manifold 13 near the bottom to supply the doping gas from the doping gas supply source 29. The doping gas line 30 is provided with a switching valve 31 and a flow rate controller 32, such as a mass flow controller, to supply the doping gas at a controlled flow rate. The doping gas may be a phosphorous doping gas for doping a film with phosphorous (P) or a boron doping gas for doping a film with boron (B). The phosphorous doping gas may be phosphine ($PH_3$) gas. The boron doping gas may be boron fluoride ($BF_3$) gas.

The grain size adjusting gas supply mechanism 23 includes a grain size adjusting gas supply source 33 and a grain size adjusting gas line 34 penetrating the sidewall of the manifold 13 near the bottom to supply the grain size adjusting gas from the grain size adjusting gas supply source 33. The grain size adjusting gas line 34 is provided with a switching valve 35 and a flow rate controller 36, such as a mass flow controller, to supply the grain size adjusting gas at a controlled flow rate. The grain size adjusting gas is conceived to supply a component to bond with Si of poly-silicon crystal and thereby to retard columnar crystal formation from the poly-silicon crystal and to promote miniaturization of the poly-silicon crystal. Such a component may be selected from carbon (C), nitrogen (N), and oxygen (O), and at least one of them is preferably used. Accordingly, the grain size adjusting gas may be selected from gases containing at least one of these components, such as a C-containing gas, an N-containing gas, and an O-containing gas. Specifically, this gas may be formed of one of or a plurality of $C_2H_4$ gas, $N_2O$ gas, NO gas, and $NH_3$ gas. Of them, $C_2H_4$ gas used as a C-containing gas is preferable in light of stability, controllability, and effectiveness.

An exhaust line 38 is connected to the sidewall of the manifold 13 near the upper side to exhaust the process gases through the gap between the outer tube 11 and inner tube 12. The exhaust line 38 is connected to a vacuum pump 39 for exhausting gas from inside the reaction tube 10 through a pressure adjusting mechanism 40 including a pressure adjusting valve and so forth provided thereon. The interior of the reaction tube 10 is exhausted by the vacuum pump 39 while the pressure adjusting mechanism 40 is used to adjust the pressure inside the reaction tube 10 at a predetermined value.

The film formation apparatus 1 includes a control section 50 comprising a computer, which controls the respective components in the apparatus 1, such as the drive mechanisms of the valves, mass flow controllers, heater power supply, and elevating mechanism. The control section 50 includes a storage portion that stores recipes including process parameters and process sequences for performing processes in the film formation apparatus 1 and programs for reading the recipe and so forth.

Figure 12:
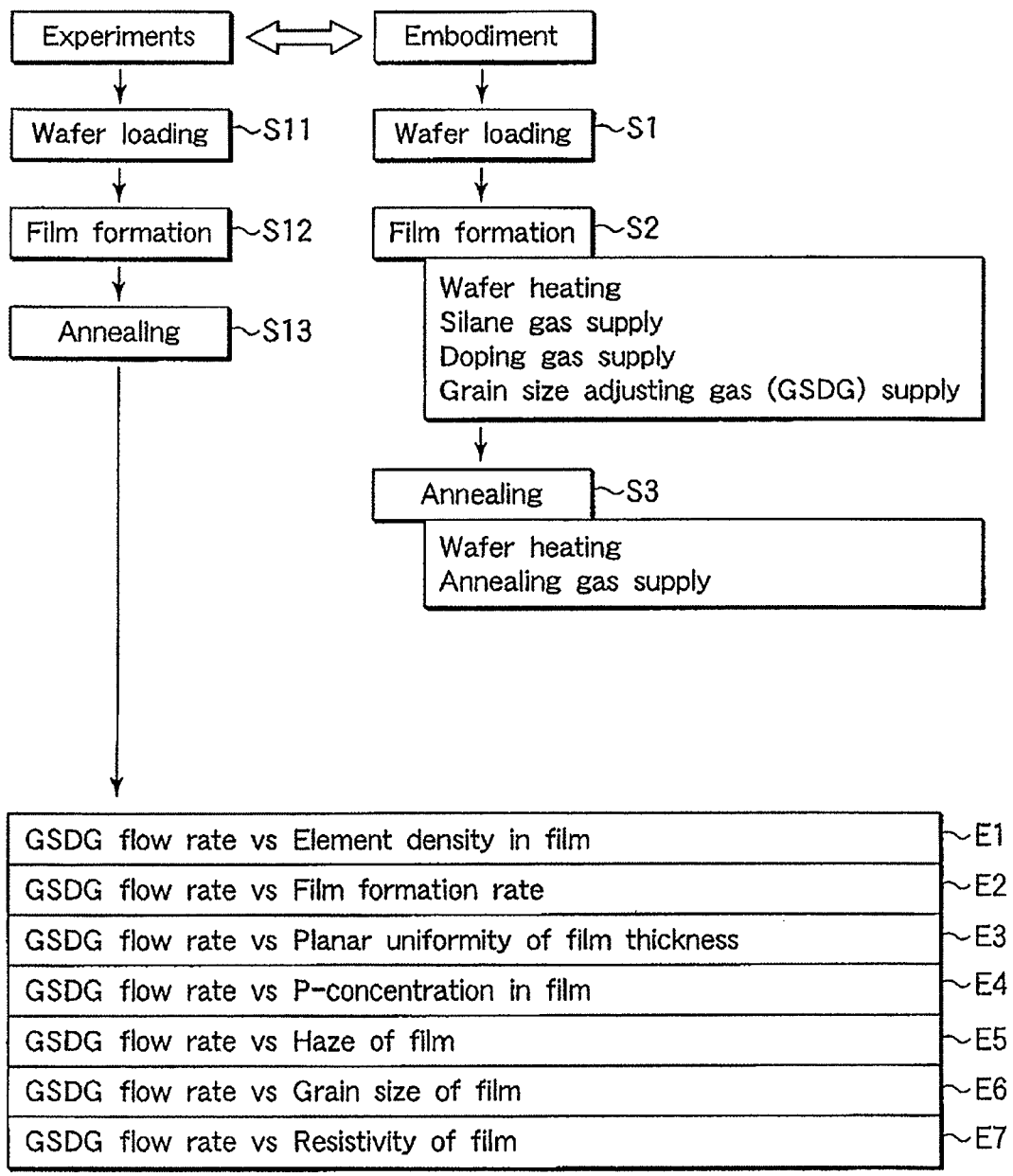
FIG. 12 is a flow chart showing a preferred embodiment of a film formation method according to the present invention.

Next, with reference to FIG. 12, an explanation will be given of a film formation method performed in the film formation apparatus described above.

At first, the interior of the reaction tube 10 is heated by the heater 4, such that the center of the wafer boat 20 (the central portion in the vertical direction) is set at a temperature preferably of 400 to 650°, such as 525°. In this state, the wafer boat 20 with a number of, such as 150, wafers W supported thereon is loaded into the reaction tube 10 through the bottom port by the elevating stage 16 (S1 in FIG. 12).

Then, the interior of the reaction tube 10 is vacuum-exhausted to a vacuum level of 0.133 to 26.6 Pa, such as 0.399 Pa. Thereafter, a film formation gas, such as monosilane gas, is supplied from the film formation gas supply source 25 through the film formation gas line 26 into the inner tube 12 at a flow rate of 100 to 3,000 mL/min (sccm), and preferably of 300 to 2,000 mL/min. At the same time, a doping gas is supplied from the doping gas supply source 29 through the doping gas line 30 into the inner tube 12 at a flow rate smaller than that of the film formation gas. Where a phosphorous doping gas, such as phosphine gas, is used, it is supplied at a flow rate of 1 to 500 mL/min (sccm), and preferably of 50 to 300 mL/min. Where a boron doping gas, such as boron fluoride gas, is used in place of a phosphorous doping gas, it is supplied at a flow rate of 0.05 to 50 mL/min (sccm), and preferably of 0.5 to 10 mL/min.

Further, simultaneously with supply of the film formation gas and doping gas, a grain size adjusting gas is supplied from the grain size adjusting gas supply source 33 through the grain size adjusting gas line 34 into the inner tube 12 at a flow rate smaller than that of the film formation gas. The appropriate flow rate of the grain size adjusting gas differs depending on the type of the gases. Where $C_2H_4$ gas is used, it is supplied at a flow rate of 1 to 100 mL/min (sccm), and preferably of 5 to 50 mL/min. Where $N_2O$ gas is used, it is supplied at a flow rate of 50 mL/min (sccm) or less. Where NO gas is used, it is supplied at a flow rate of 1 to 5 mL/min (sccm). Where $NH_3$ gas is used, it is supplied at a flow rate of 1 to 100 mL/min (sccm).

Then, the interior of the reaction tube 10 is exhausted to a pressure preferably of 26.6 to 266.6 Pa, such as 53.3 Pa, and the wafer boat 20 is rotated at a rotation number of, e.g., 1 to 10 rpm. By use of these conditions, a film formation process is performed for 30 minutes (S2 in FIG. 12).

Where the film formation gas is disilane gas, and the grain size adjusting gas is $C_2H_4$ gas, the process conditions may be set as follows. Specifically, disilane gas is supplied at a flow rate of 10 to 1,000 mL/min (sccm), and preferably of 50 to 500 mL/min. $C_2H_4$ gas is supplied at a flow rate of 1 to 100 mL/min (sccm), and preferably of 1 to 50 mL/min. The flow rate of the doping gas may be set to fall within the same range as, described above. The film formation temperature is set to be 350 to 650 ° C., while the film formation pressure is set to be 6.67 to 1,333.3 Pa, and preferably to be 26.6 to 666.6 Pa.

By the film formation process performed as described above, an amorphous silicon film doped with phosphorous is deposited. Where boron fluoride gas is used in place of phosphine gas, an amorphous silicon film doped with boron is deposited in the same way.

After the film formation process, a purge gas, such as $N_2$ gas, is supplied through a purge gas line (not shown) into the reaction tube 10 to exhaust gas from inside the reaction tube 10. Then, while a predetermined annealing gas, such as $N_2$ gas, is supplied, an annealing process is performed at a pressure higher than the film formation pressure and at a temperature higher than the film formation temperature (S3 in FIG. 12). The annealing pressure is preferably set to be 2,666 to 101,330 Pa, and more preferably to be 91,997 to 101,330 Pa. The annealing temperature is set to be preferably of 550 to 1,100°, such as 950°. The annealing process may be performed by use of a separate heat processing apparatus.

By the annealing process performed as described above, the amorphous silicon film is crystallized and transformed into a poly-silicon film. The poly-silicon film doped with phosphorous or boron thus formed has a fine crystal grain size, and so micro-fabrication of semiconductor devices can be performed very well.

In this respect, conventional poly-silicon films doped with phosphorous or boron have a grain size of about 300 nm, which makes it difficult to satisfy a required micro-fabrication. On the other hand, according to the present invention, the grain size adjusting gas is used to supply a component to bond with Si of poly-silicon crystal and thereby to retard columnar crystal formation from the poly-silicon crystal and to promote miniaturization of the poly-silicon crystal. Specifically, for this purpose, by use of at least one of a C-containing gas, an N-containing gas, and an O-containing gas that contain carbon (C), nitrogen (N), and oxygen (O), respectively, the silicon crystal is miniaturized to be 100 nm or less, thereby facilitating predetermined micro-fabrication.

This is due to the mechanism that Si—C bonds, Si—N bonds, and Si—O bonds are formed when carbon (C), nitrogen (N), and oxygen (O) are supplied into a poly-silicon film, respectively. The poly-silicon crystal is formed of columnar crystals and can be grown to have larger columnar crystals with progress of crystallization. However, where Si—C bonds, Si—N bonds, and/or Si—O bonds are formed, these bonds retard growth of columnar crystals and promote formation of random and miniaturized crystals.

The C-containing gas, N-containing gas, and O-containing gas are required to decompose at a temperature not higher than the film formation temperature and to diffuse C, N, and O, respectively, into the film. These gases are exemplified by $C_2H_4$ gas, $N_2O$ gas, NO gas, and $NH_3$ gas, as described above.

Next, with further reference to FIG. 12, an explanation will be given of results of experiments of film formation performed by use of a grain size adjusting gas.

Specifically, in the apparatus shown in FIG. 1, experiments were performed such that a poly-silicon film doped with phosphorous was formed on 50 wafers supported on the wafer boat (S11 in FIG. 12), wherein $SiH_4$ gas was used as the film formation gas, $PH_3$ gas was used as the doping gas, $C_2H_4$ gas, $N_2O$ gas, and NO gas were individually used as the grain size adjusting gas. The basic conditions were set as follows.

(1) Film formation process: (S12 in FIG. 12):
Temperature: 525° C.,
Pressure inside reaction tube: 53.3 Pa,
$SiH_4$ gas flow rate: 500 mL/min (sccm), and
$PH_3$ gas flow rate: 56.3 mL/min (sccm).

(2) Annealing process (S13 in FIG. 12):
Temperature: 950° C.,
Pressure inside reaction tube: 96,000 Pa, and
Annealing gas ($N_2$ gas) flow rate: 10,000 mL/min (sccm).

In a first experiment (E1 in FIG. 12), film formation processes were performed by use of $C_2H_4$ gas, $N_2O$ gas, and NO gas, respectively, while the flow rate of each gas was set at different values, and the density of elements in the films thus formed was measured by a SIMS (secondary ion mass spectrometer). The measurement conditions were set as follows.

Primary ion type: $Cs^+$,
Primary acceleration voltage: 3.0 kV,
Detection area: 180 mm×180 mm, and
Measuring machine: PHI ADEPT1010.

Figure 2A:
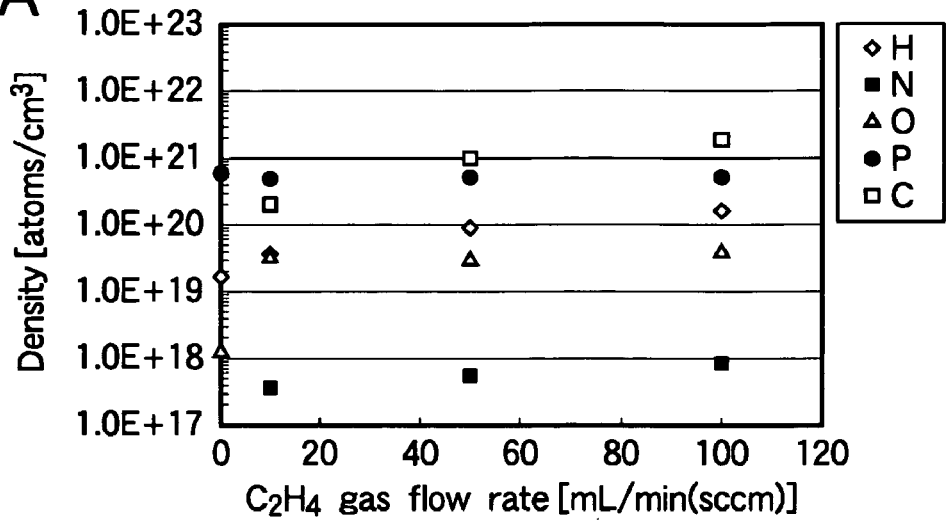
FIGS. 2A, 2B, and 2C are graphs showing the density of elements in amorphous silicon films doped with phosphorous, measured by a SIMS (secondary ion mass spectrometer), where the films were formed by use of $C_2H_4$ gas, $N_2O$ gas, and NO gas, respectively, while the flow rate of each gas was set at different values.
Figure 2B:
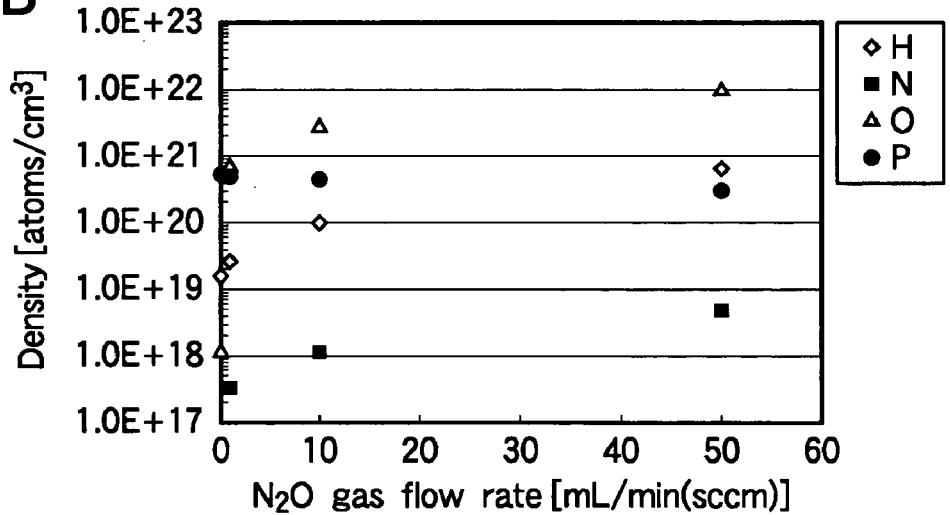
Figure 2C:
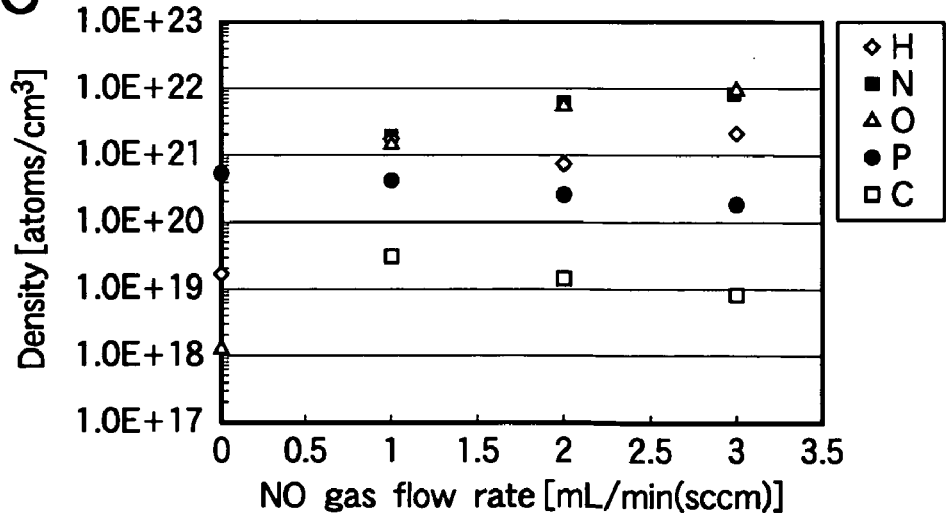

FIGS. 2A to 2C show results of this experiment, wherein FIG. 2A is from the $C_2H_4$ gas, FIG. 2B from the $N_2O$ gas, and FIG. 2C from the NO gas. As shown in FIGS. 2A to 2C, the use of $C_2H_4$ gas caused C to be introduced into the film, the use of $N_2O$ gas mainly caused O to be introduced into the film (although, N was also introduced), and the use of NO gas mainly caused N to be introduced into the film (although, O was also introduced). In each case, the introduction amount of the element into the film was increased in proportion to the gas flow rate.

Figure 3:
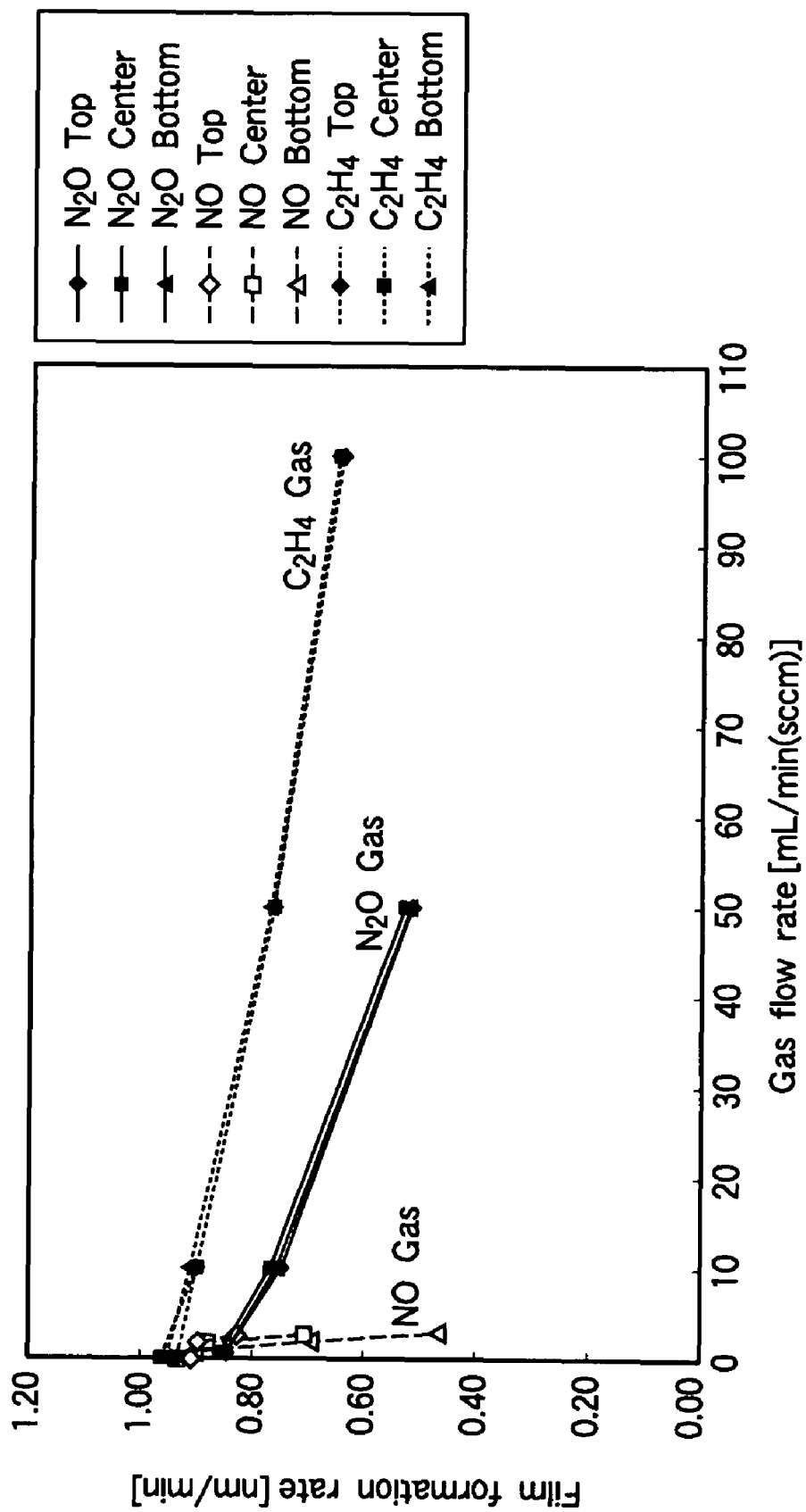
FIG. 3 is a graph showing the relationship between the flow rate and film formation rate, where amorphous silicon films doped with phosphorous were formed by use of $C_2H_4$ gas, $N_2O$ gas, and NO gas, respectively, while the flow rate of each gas was set at different values.

In a second experiment (E2 in FIG. 12), under the conditions described above, film formation processes were performed by use of $C_2H_4$ gas, $N_2O$ gas, and NO gas, respectively, while the flow rate of each gas was set at different values, and the film formation rate was measured on wafers at the top, center, and bottom of the wafer boat. FIG. 3 shows results of this experiment. As shown in FIG. 3, the film formation rate greatly differed depending on the type of the gases, wherein the use of $C_2H_4$ gas rendered the smallest change in the film formation rate with a change in the flow rate. In comparison with the uses of NO gas and $N_2O$ gas with each other, the use of NO gas rendered a more abrupt decrease in the film formation rate with an increase in the flow rate, i.e., this change was more dependent on the supply rate of NO gas. Accordingly, the uses of $C_2H_4$ gas and $N_2O$ gas rendered a constant film formation rate among the wafers without being affected by the flow rate, while the use of NO gas rendered a large variation in the film formation rate among the wafers at a small flow rate of 3 mL/min (sccm).

Figure 4:
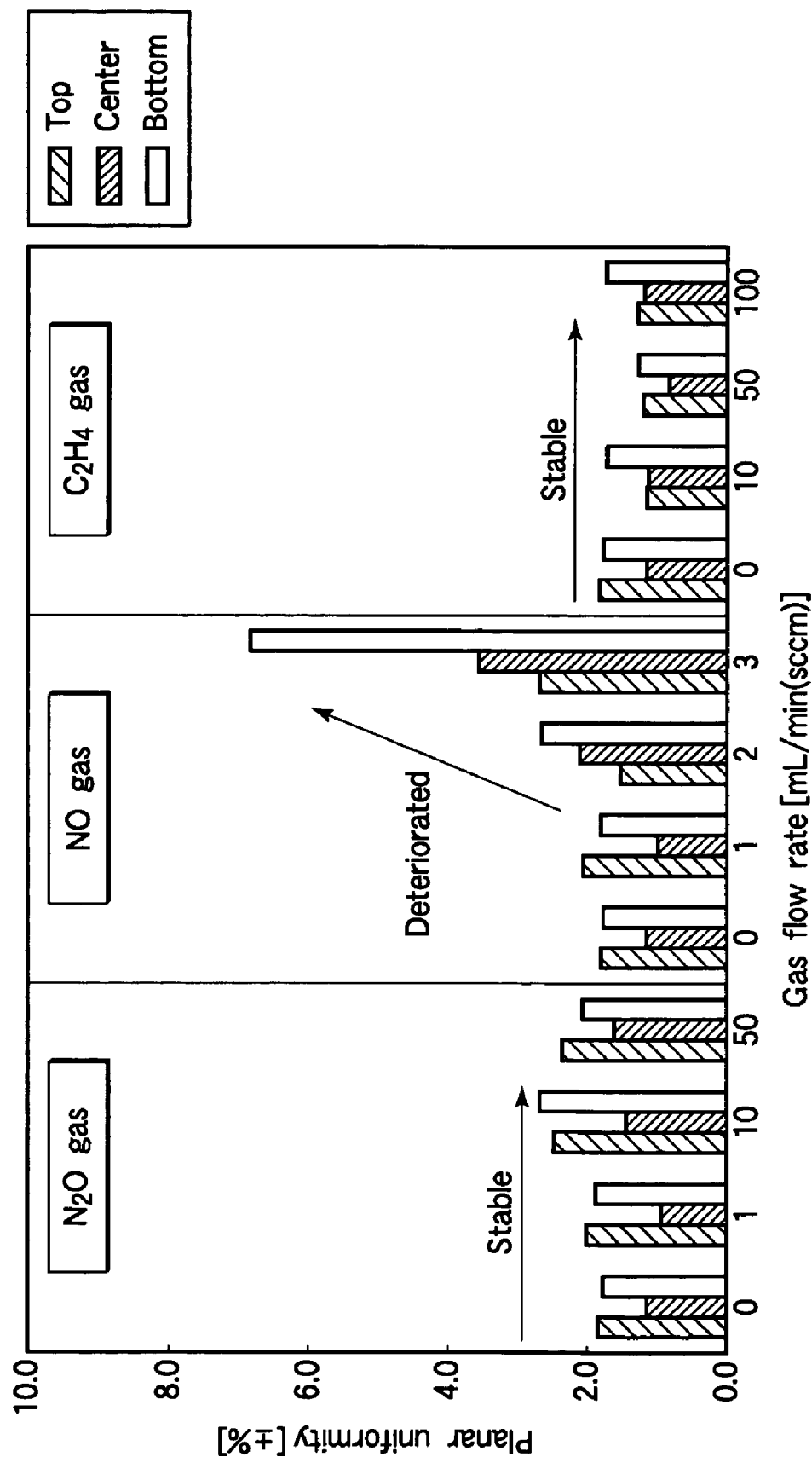
FIG. 4 is a graph showing the planar uniformity of film thickness on wafers at the top, center, and bottom of a wafer boat, where amorphous silicon films doped with phosphorous were formed by use of $C_2H_4$ gas, $N_2O$ gas, and NO gas, respectively, while the flow rate of each gas was set at different values.

In a third experiment (E3 in FIG. 12), under the conditions described above, film formation processes were performed by use of $C_2H_4$ gas, $N_2O$ gas, and NO gas, respectively, while the flow rate of each gas was set at different values, and the planar uniformity of film thickness was measured on wafers at the top, center, and bottom of the wafer boat. FIG. 4 shows results of this experiment. As shown in FIG. 4, the uses of $C_2H_4$ gas and $N_2O$ gas rendered a stable planar uniformity without being affected by the flow rate and wafer position, while the use of NO gas rendered a strong dependence on the flow rate such that the planar uniformity was far worse on the bottom side at 3 mL/min (sccm).

Judging from the results shown in FIGS. 3 and 4, it has been confirmed that the use of $C_2H_4$ gas as a C-doping gas is the most preferable in terms of stability for the film formation rate.

Figure 5:
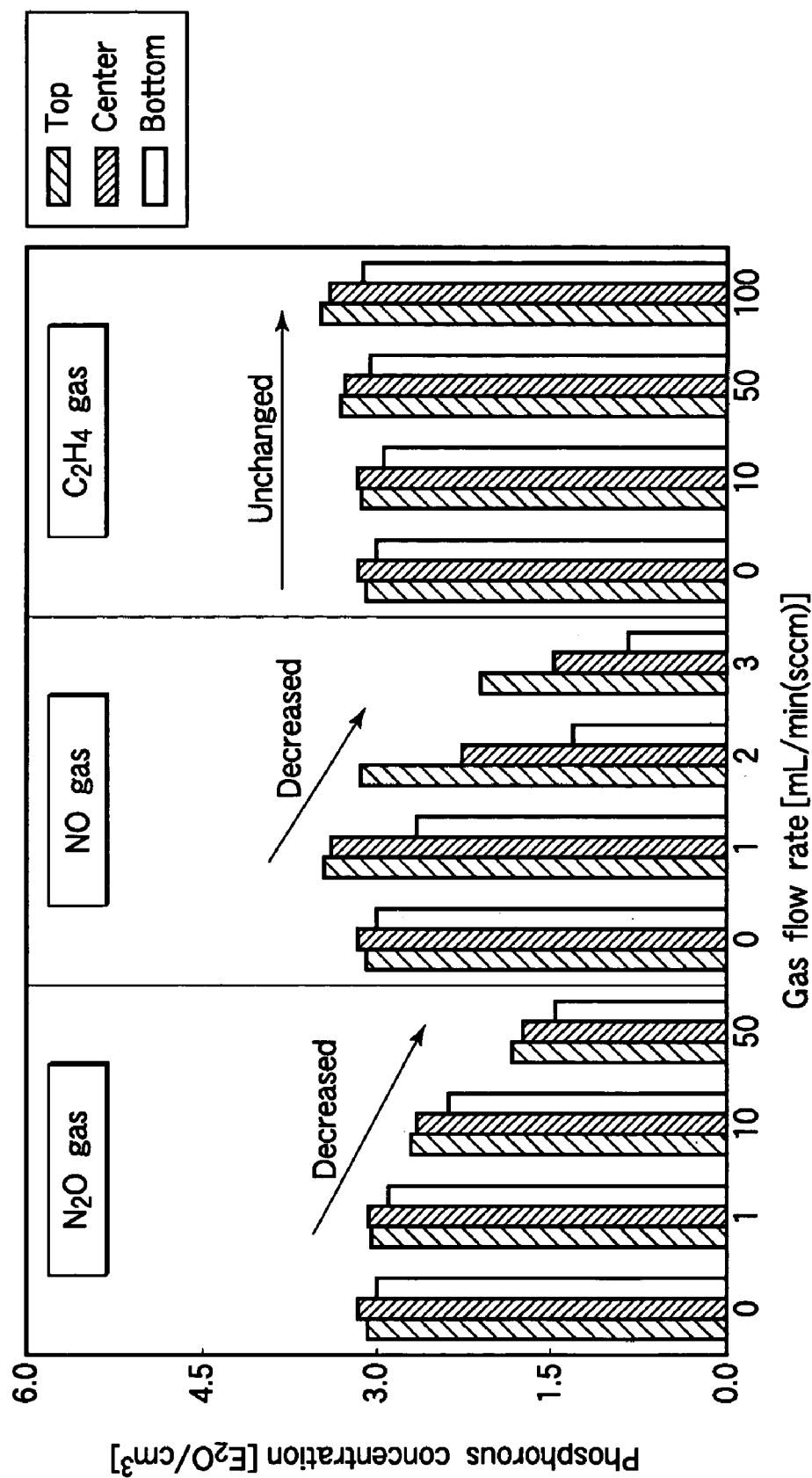
FIG. 5 is a graph showing the phosphorous concentration in films on wafers at the top, center, and bottom of a wafer boat, where film formation processes were performed by use of $C_2H_4$ gas, $N_2O$ gas, and NO gas, respectively, while the flow rate of each gas was set at different values.

In a fourth experiment (E4 in FIG. 12), under the conditions described above, film formation processes were performed by use of $C_2H_4$ gas, $N_2O$ gas, and NO gas, respectively, while the flow rate of each gas was set at different values, and the phosphorous concentration in films was measured on wafers at the top, center, and bottom of the wafer boat. FIG. 5 shows results of this experiment. As shown in FIG. 5, the use of $C_2H_4$ gas rendered essentially no change in the phosphorous concentration with a change in the flow rate, as well as a very small variation in the phosphorous concentration among the wafers. On the other hand, the uses of $N_2O$ gas and NO gas rendered a decrease in the phosphorous concentration with an increase in the flow rate. Further, the use of NO gas rendered a large variation in the phosphorous concentration among the wafers at a flow rate of 3 mL/min (sccm). Where annealing was used along with the conditions described above, almost the same pattern was obtained. Judging from the results described above, it has been confirmed that the use of $C_2H_4$ gas as a C-doping gas is the most preferable in terms of stability for the phosphorous concentration.

Figure 6:
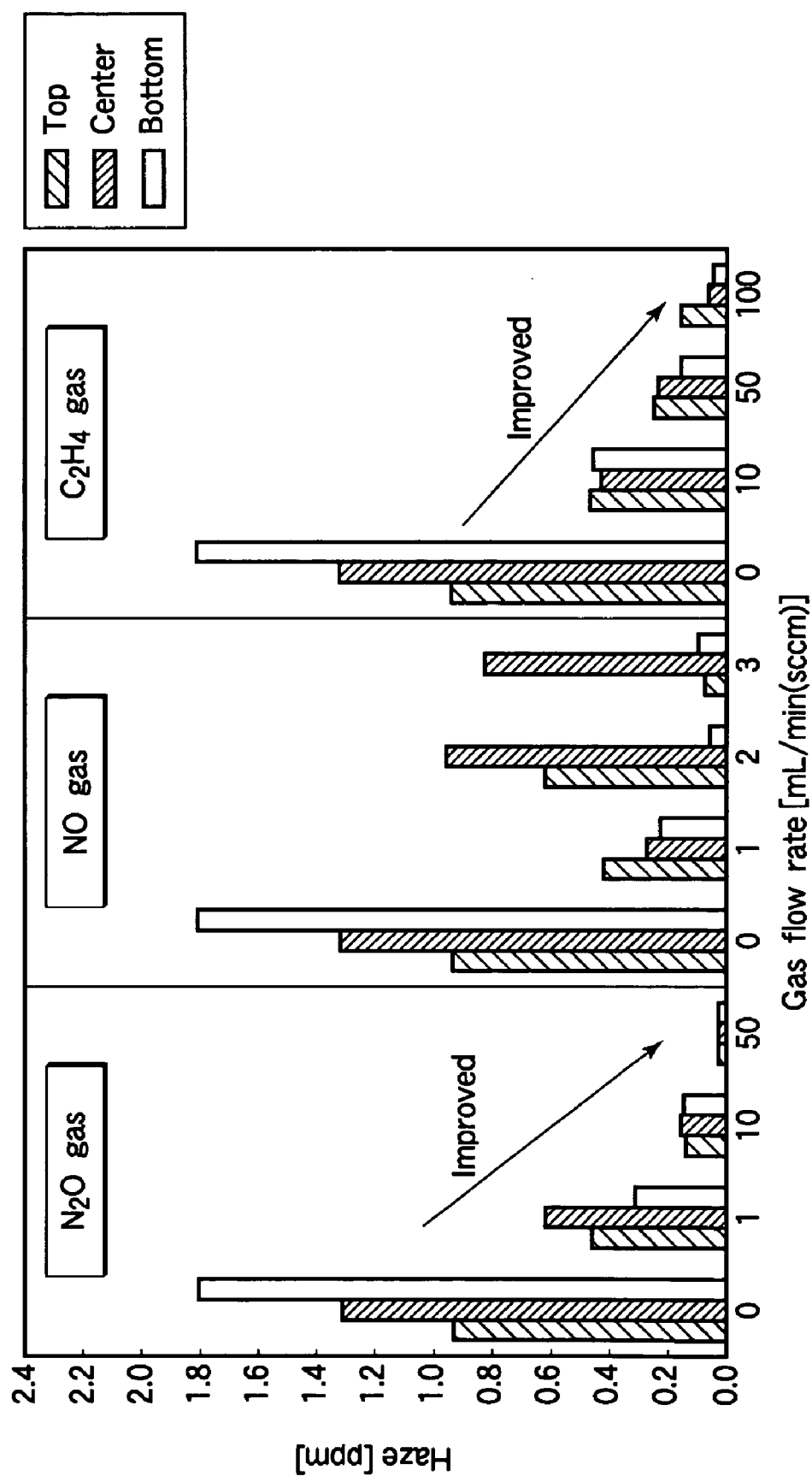
FIG. 6 is a graph showing the Haze of films on wafers at the top, center, and bottom of a wafer boat, where film formation processes were performed by use of $C_2H_4$ gas, $N_2O$ gas, and NO gas, respectively, while the flow rate of each gas was set at different values.

In a fifth experiment (E5 in FIG. 12), under the conditions described above, film formation processes were performed by use of $C_2H_4$ gas, $N_2O$ gas, and NO gas, respectively, while the flow rate of each gas was set at different values, and the Haze of films was measured on wafers at the top, center, and bottom of the wafer boat. The Haze is an index representing a surface state (surface roughness) wherein a lower value thereof denotes a better surface state. The Haze is obtained by detecting the uniformity, roughness, and fin unevenness of a processed wafer surface on the basis of low frequency signals generated due to scatter of a laser beam in a dark field test. FIG. 6 shows results of this experiment. As shown in FIG. 6, the uses of $C_2H_4$ gas and $N_2O$ gas rendered sufficient improvement of the surface state with an increase in the flow rate. However, the use of NO gas did not render sufficient improvement of the surface state with an increase in the flow rate.

Figure 7:
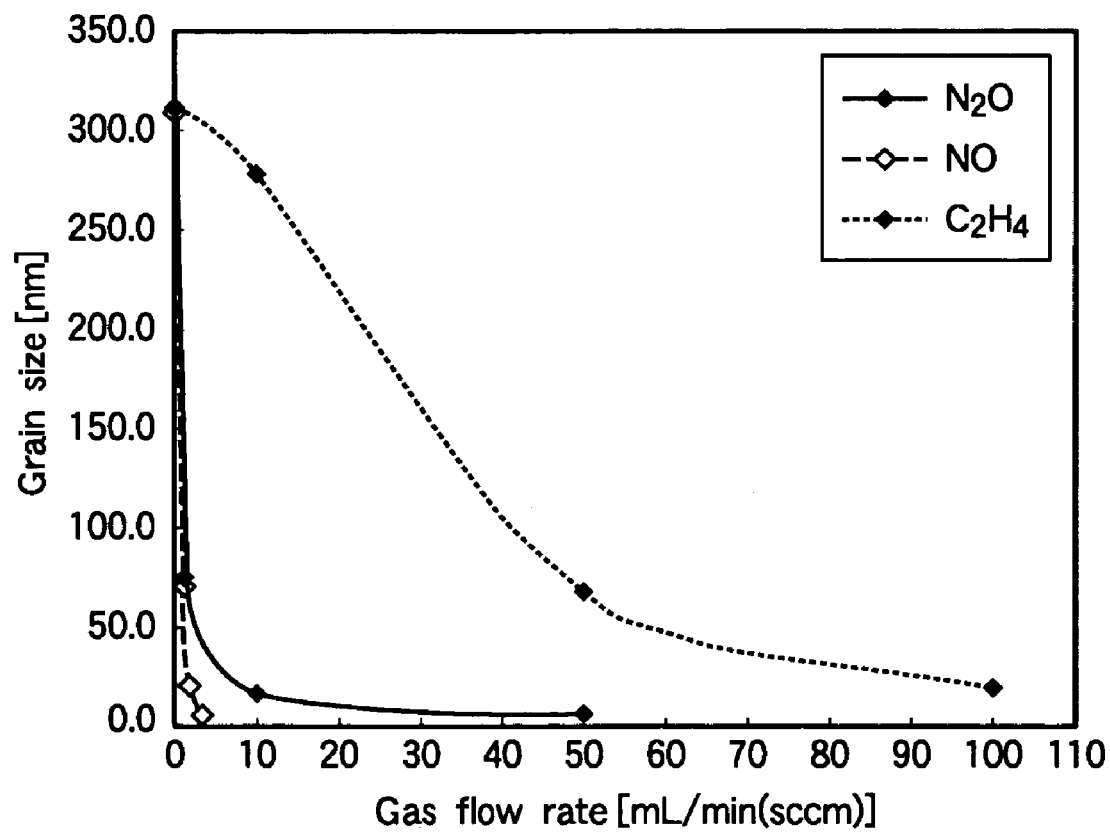
FIG. 7 is a graph showing the relationship between the flow rate and grain size, where film formation processes were performed by use of $C_2H_4$ gas, $N_2O$ gas, and NO gas, respectively, while the flow rate of each gas was set at different values, and followed by annealing to obtain poly-silicon films.
Figure 8:
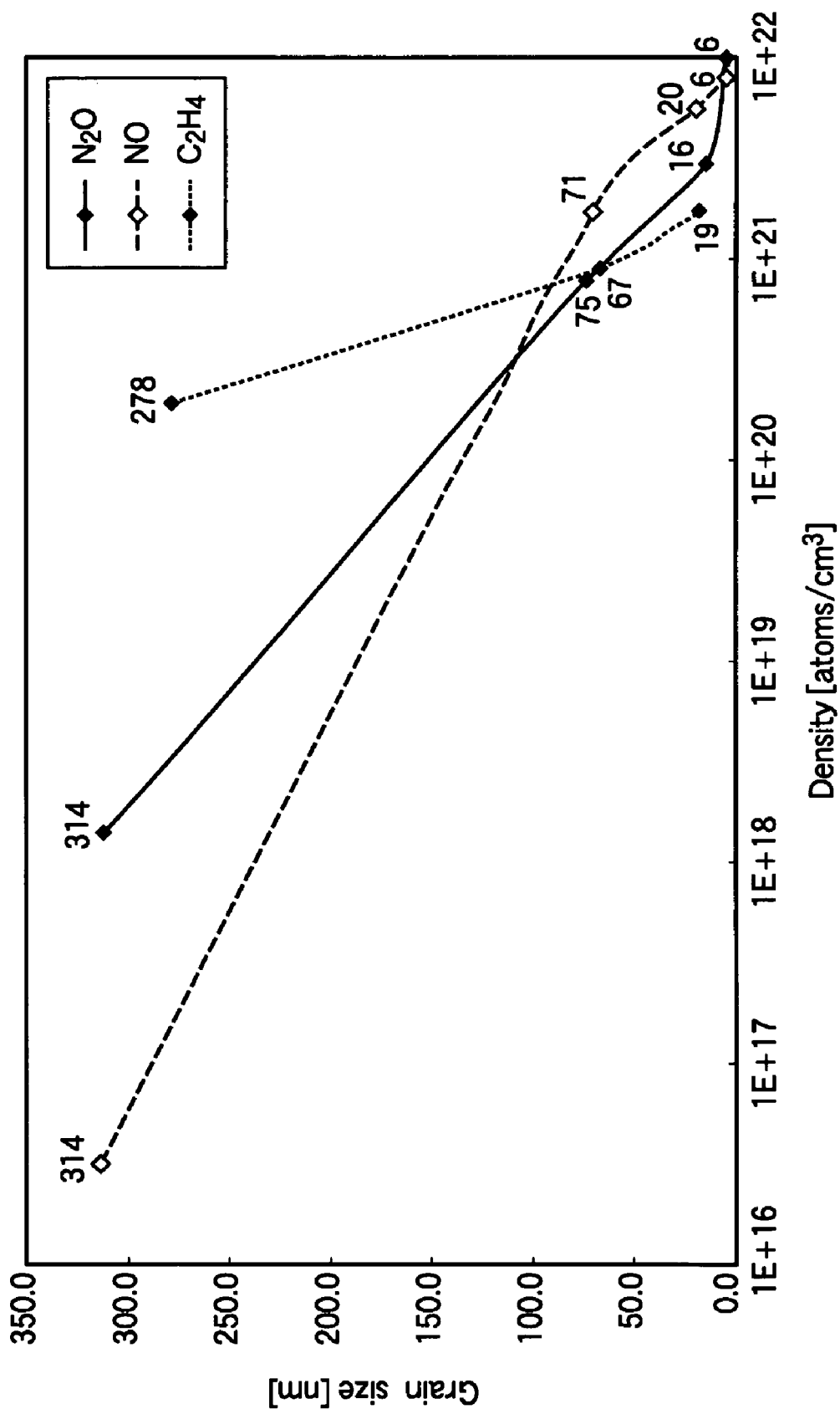
FIG. 8 is a graph showing the relationship between the concentration of elements and grain size, where film formation processes were performed by use of $C_2H_4$ gas, $N_2O$ gas, and NO gas, respectively, while the flow rate of each gas was set at different values, and followed by annealing to obtain poly-silicon films.

In a sixth experiment (E6 in FIG. 12), under the conditions described above, film formation processes were performed by use of $C_2H_4$ gas, $N_2O$ gas, and NO gas, respectively, while the flow rate of each gas was set at different values, and followed by annealing to obtain poly-silicon films, and then the grain size of the films was measured. The grain size was measured by grain size analysis on a photographed image taken by a transmission electron microscope (TEM). FIG. 7 shows the relationship between the flow rate and grain size obtained by this experiment. As shown in FIG. 7, the use of each gas provided the effect of decreasing the grain size to a target level of 100 nm or less. Of them, use of NO gas rendered an abrupt decrease in the grain size at a small flow rate. On the other hand, the use of $C_2H_4$ gas rendered the smallest decreasing rate in the grain size with a change in the flow rate. The use of $N_2O$ gas rendered a middle level of the effect between them. However, the uses of the three gases did not show a large difference in the achieved grain size. Judging from the results described above, it has been confirmed that the use of $C_2H_4$ gas is the most preferable to obtain a predetermined grain size in light of controllability, because the grain size gradually changes with a change in the flow rate. FIG. 8 is a graph showing the relationship between the concentration of elements and grain size. As regards the concentration of elements, the horizontal axis of FIG. 8 denotes O concentration in the film for $N_2O$ gas, N concentration in the film for NO gas, and C concentration in the film for $C_2H_4$ gas, which correspond to the result of the SIMS shown in FIGS. 2A to 2C. As shown in FIG. 8, the use of $C_2H_4$ gas rendered a good linearity of a change in the grain size with a change in the C concentration. This also supports that the use of $C_2H_4$ gas is the most preferable in light of grain size controllability.

Figure 9:
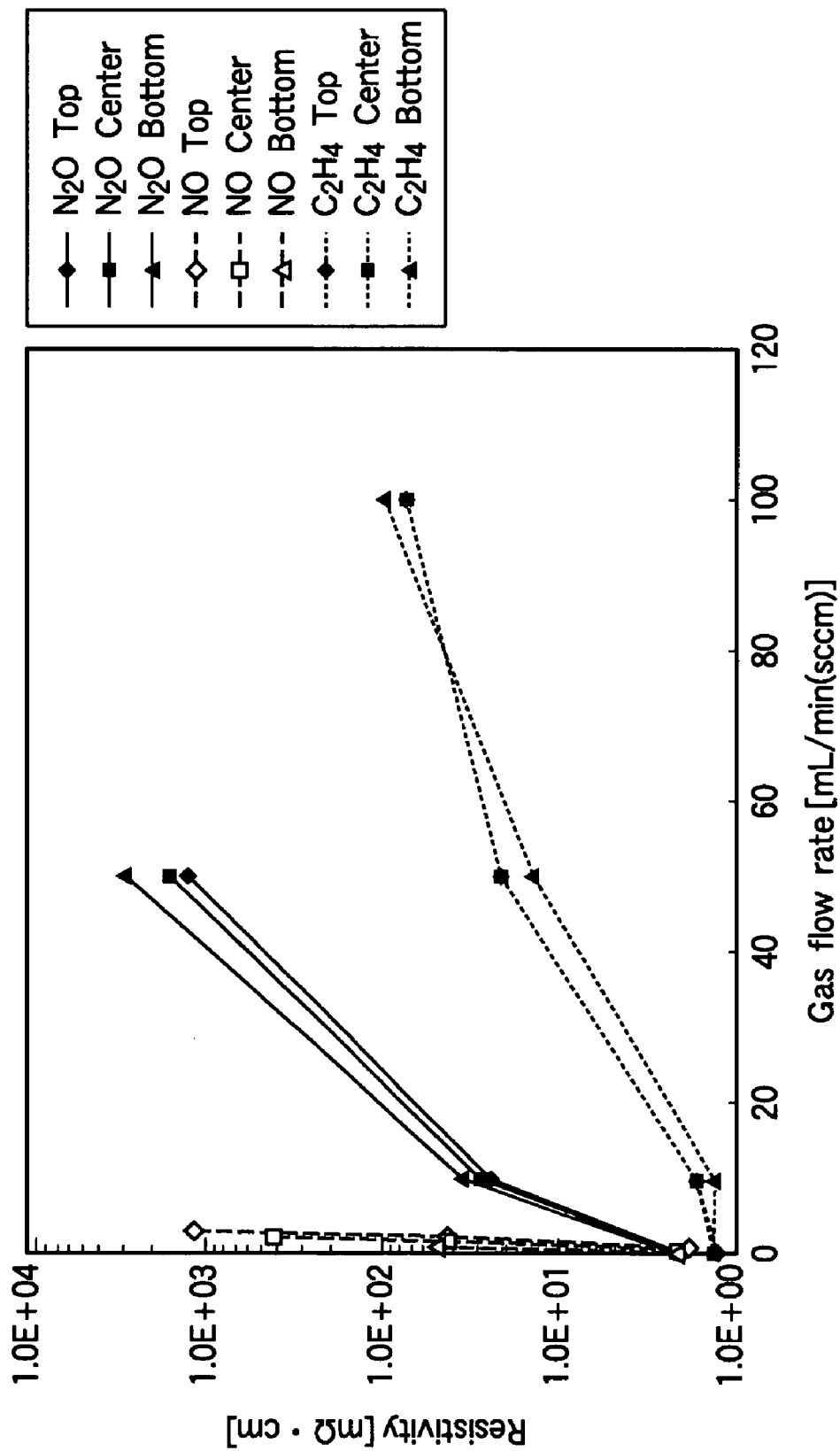
FIG. 9 is a graph showing the relationship between the flow rate and resistivity, where film formation processes were performed by use of $C_2H_4$ gas, $N_2O$ gas, and NO gas, respectively, while the flow rate of each gas was set at different values, and followed by annealing to obtain poly-silicon films.
Figure 10:
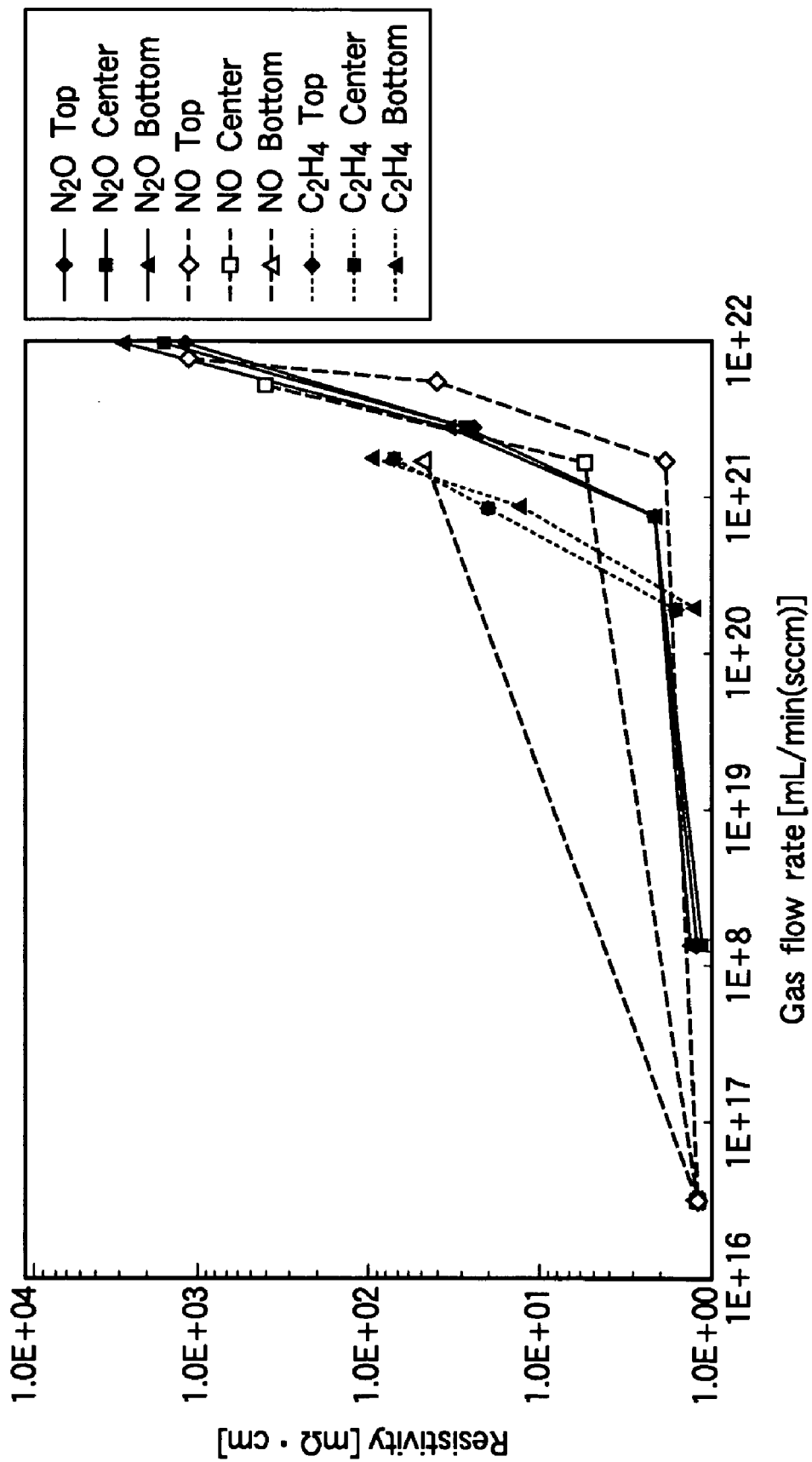
FIG. 10 is a graph showing the relationship between the concentration of elements and resistivity, where film formation processes were performed by use of $C_2H_4$ gas, $N_2O$ gas, and NO gas, respectively, while the flow rate of each gas was set at different values, and followed by annealing to obtain poly-silicon films.
Figure 11:
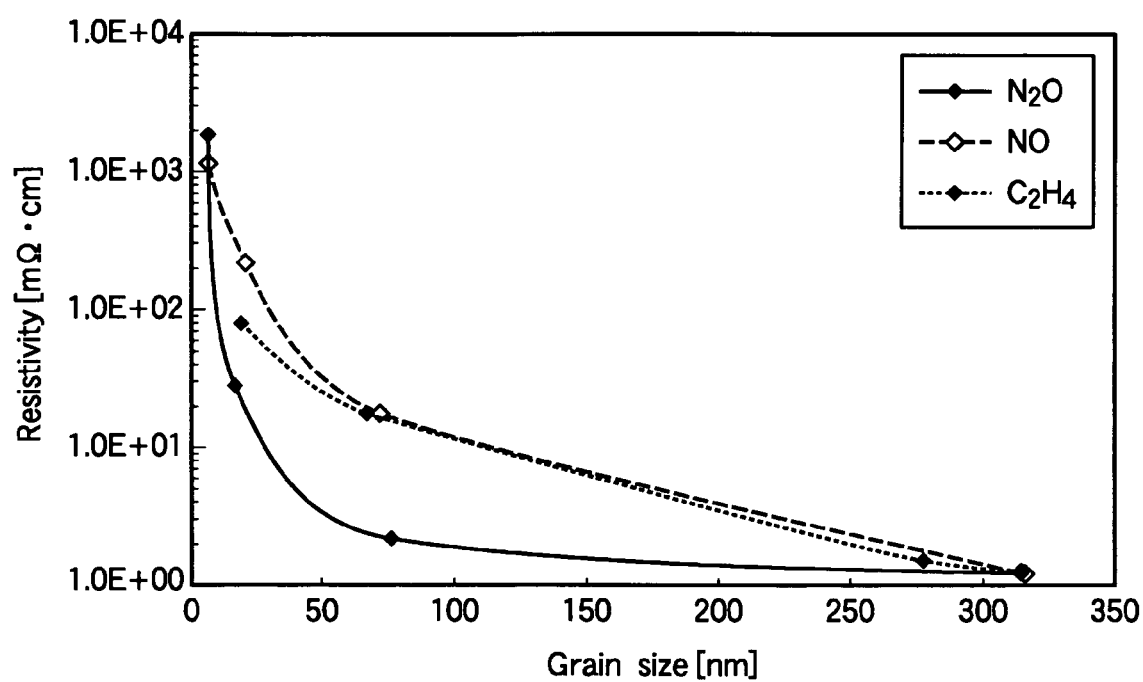
FIG. 11 is a graph showing the relationship between the grain size and resistivity, where film formation processes were performed by use of $C_2H_4$ gas, $N_2O$ gas, and NO gas, respectively, and followed by annealing to obtain poly-silicon films.

In a seventh experiment (E7 in FIG. 12), under the conditions described above, film formation processes were performed by use of $C_2H_4$ gas, $N_2O$ gas, and NO gas, respectively, while the flow rate of each gas was set at different values, and followed by annealing to obtain poly-silicon films, and then the resistivity of the films was measured. FIG. 9 shows the relationship between the flow rate and resistivity obtained by this experiment. As shown in FIG. 9, the resistivity greatly differed depending on the type of the gases, but the use of each gas rendered an increase in the resistivity with an increase in the gas flow rate, wherein the use of $C_2H_4$ gas tended to show the lowest resistivity. FIG. 10 is a graph showing the relationship between the concentration of elements and resistivity. As regards the concentration of elements, the horizontal axis of FIG. 10 denotes O concentration in the film for $N_2O$ gas, N concentration in the film for NO gas, and C concentration in the film for $C_2H_4$ gas, which correspond to the result of the SIMS shown in FIGS. 2A to 2C. As shown in FIG. 10, the use of C tended to show the lowest resistivity, although this was not necessarily satisfied because the resistivity also depended on the phosphorous concentration in the film. FIG. 11 is a graph showing the relationship between the grain size denoted on the horizontal axis and the resistivity denoted on the vertical axis. As shown in FIG. 11, the resistivity increased with a decrease in the grain size.

Judging from the results described above, it has been confirmed that the grain size adjusting gas may comprise any one of NO gas used as an N-containing gas, $N_2O$ gas used as an O-containing gas, and $C_2H_4$ gas used as a C-containing gas, but the use of $C_2H_4$ gas as a C-containing gas is the most preferable in light of the stability, controllability, and resistivity as a whole. Further, since the resistivity increases with a decrease in the grain size, the flow rate of the grain size adjusting gas should be determined to set a grain size that makes the resistivity fall in an allowable range.

According to the embodiment of the present invention described above, film formation is performed while supplying a grain size adjusting gas that contains a component to retard columnar crystal formation from a poly-silicon crystal and to promote miniaturization of the poly-silicon crystal. Consequently, a poly-silicon film doped with phosphorous or boron is formed to have fine crystal grains.

The present invention is not limited to the embodiment described above, and it may be modified in various manners. For example, in the embodiment described above, an amorphous silicon film is first formed, and is then poly-crystallized by annealing. Alternatively, the present invention may be applied to a case where film formation is performed at a poly-silicon formation temperature of 600° C. or more to directly form a poly-silicon film. In the embodiment described above, a batch process is performed to process a plurality of substrates all together. Alternatively, the present invention may be applied to a single-substrate process.

The grain size adjusting gas may be a gas other than those described in the embodiment, as long as the gas contains a component to bond with Si of poly-silicon crystal and thereby to retard columnar crystal formation from the poly-silicon crystal and to promote miniaturization of the poly-silicon crystal. The target object is not limited to a semiconductor wafer, and it may be another substrate, such as a glass substrate used for an FPD (flat panel display).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A poly-silicon film formation method for forming a poly-silicon film doped with phosphorous or boron, the method comprising:
    performing a film formation process of depositing an amorphous silicon film doped with phosphorous or boron on a target substrate, by setting an interior of a reaction container accommodating the target substrate at a first pressure of a vacuum atmosphere and a first temperature of 400 to 650° C. and supplying into the reaction container a silane family gas at a first flow rate, a doping gas for doping a film with phosphorous or boron at a second flow rate smaller than the first flow rate, and $C_2H_4$ as a grain size adjusting gas, which contains a component to retard columnar crystal formation to promote miniaturization of poly-silicon crystals, at a third flow rate smaller than the first flow rate; and
    performing an annealing process on the amorphous silicon film, while setting the interior of the reaction container accommodating the target substrate at a second pressure higher than the first pressure and a second temperature of 550 to 1,100° C. and higher than the first temperature, thereby transforming the amorphous silicon film into a poly-silicon film that is doped with phosphorous or boron, and that has an average grain size of 100 nm or less, wherein
    said method further comprises conducting an experiment, which includes performing the film formation process with different values of the third flow rate followed by the annealing process to form poly-silicon film examples, and measuring grain sizes of the examples to obtain values of the third flow rate that make the grain size 100 nm or less.

2. The method according to claim 1, wherein the silane family gas comprises $SiH_4$ gas or $Si_2H_6$ gas.

3. The method according to claim 2, wherein the doping gas comprises $PH_3$ gas or $BF_3$ gas.

4. The method according to claim 3, wherein the silane family gas is $SiH_4$ gas, the first flow rate is 100 to 3,000 mL/min, and the third flow rate is 1 to 100 mL/min.

5. The method according to claim 4, wherein the doping gas is $PH_3$ gas and the second flow rate is 1 to 500 mL/min.

6. The method according to claim 4, wherein the doping gas is $BF_3$ gas and the second flow rate is 0.05 to 50 mL/min.

7. The method according to claim 3, wherein the silane family gas is $Si_2H_6$ gas, the first flow rate is 10 to 1,000 mL/min, and the third flow rate is 1 to 100 mL/min.

8. The method according to claim 7, wherein the doping gas is $PH_3$ gas and the second flow rate is 1 to 500 mL/min.

9. The method according to claim 7, wherein the doping gas is $BF_3$ gas and the second flow rate is 0.05 to 50 mL/min.

10. The method according to claim 1, wherein the first pressure is 26.6 to 266.6 Pa, and the second pressure is 91,997 to 101,330 Pa.

11. The method according to claim 1, wherein the experiment further includes measuring resistivities of the examples to confirm a relationship of the values of the third flow rate with the resistivities.

* * * * *